United States Patent
Li

(10) Patent No.: US 8,599,058 B1
(45) Date of Patent: Dec. 3, 2013

(54) DATA CONVERTER WITH REDUNDANCY FOR ERROR CORRECTION IN POLARITY DECISION

(75) Inventor: Yingxuan Li, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 310 days.

(21) Appl. No.: 13/196,368

(22) Filed: Aug. 2, 2011

Related U.S. Application Data

(63) Continuation of application No. 12/569,060, filed on Sep. 29, 2009, now Pat. No. 7,994,960.

(60) Provisional application No. 61/106,351, filed on Oct. 17, 2008.

(51) Int. Cl.
*H03M 1/34* (2006.01)

(52) U.S. Cl.
USPC .......................................... 341/158; 341/159

(58) Field of Classification Search
USPC .................. 341/158, 155, 156, 159, 131, 154
See application file for complete search history.

(56) References Cited

U.S. PATENT DOCUMENTS

| | | | |
|---|---|---|---|
| 5,099,241 A | 3/1992 | Gulczynski | |
| 6,232,907 B1 | 5/2001 | Nagaraj et al. | |
| 6,535,153 B1 * | 3/2003 | Zierhofer | 341/143 |

OTHER PUBLICATIONS

Cao et al., "A 500mW Digitally Calibrated AFE in 65nm CMOS for 10Gb/s Serial Links over Backplane and Multimode Fiber", 2009 IEEE International Solid-State Circuits Conference, ISBN 978-1-4244-3457-2/09, Feb. 11, 2009, pp. 370-372.

Verbruggen et al., "A 22mW 5b 1.75GS/s Folding Flash ADC in 90nm Digital CMOS," IEEE International Solid-State Circuits Conference, ISBN: 978-1-4244-2011-7, 252-253 and 611 (2008).

* cited by examiner

*Primary Examiner* — Joseph Lauture

(57) ABSTRACT

Systems, methods and computer program products for correcting polarity decision associated with a polarity comparator in an analog-to-digital converter are described. The polarity comparator may perform polarity decision to determine whether an analog signal is greater or smaller than zero. If the voltage difference is greater than zero, then the analog signal may be output to other comparators without polarity inversion. If the voltage difference is smaller than zero, then the signal polarity of the analog signal may be inverted before being output to other comparators. One or more redundant comparators also may be used to correct offsets of the polarity comparator to reduced errors associated with the polarity decision.

20 Claims, 12 Drawing Sheets

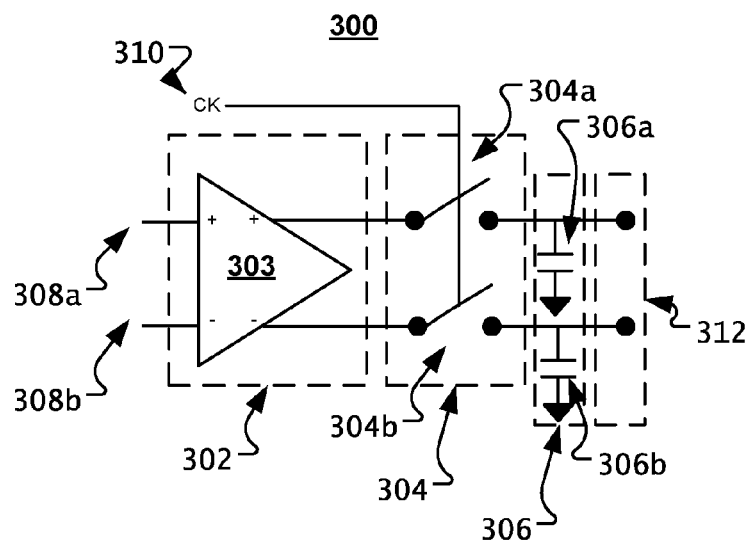
FIG. 3
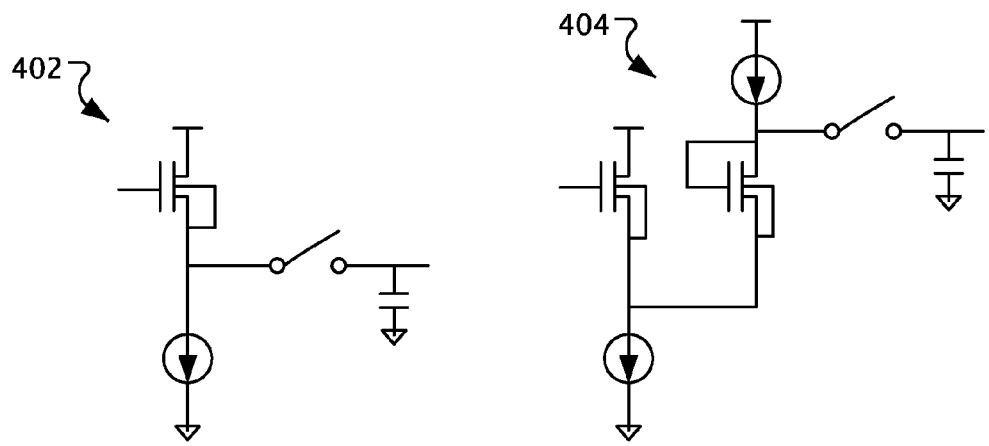
FIG. 4A    FIG. 4B

DATA CONVERTER WITH REDUNDANCY FOR ERROR CORRECTION IN POLARITY DECISION

CROSS-REFERENCE TO RELATED APPLICATIONS

This application is a continuation of U.S. patent application Ser. No. 12/569,060, titled "DATA CONVERTER WITH REDUNDANCY FOR ERROR CORRECTION IN POLARITY DECISION," filed on Sep. 29, 2009, issued on Aug. 9, 2011, as U.S. Pat. No. 7,994,960, which claims priority to U.S. Provisional Application Ser. No. 61/106,351 titled "A FOLDING RATE 2× FLASH ADC WITH REDUNDANCY TO CORRECT ERROR IN POLARITY DECISION," filed on Oct. 17, 2008, the disclosures of which are incorporated herein by reference in their entirety.

TECHNICAL FIELD

The subject matter of this application is generally related to analog-to-digital converters.

BACKGROUND

Analog-to-digital converters (ADCs) are employed in a variety of electronic systems including computer modems, wireless telephones, satellite receivers, process control systems, and the like. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers that is a digital representation of the sampled analog signal. Commonly used types of ADCs includes flash ADCs.

A conventional flash ADC typically requires $2^n-1$ comparators, where n is the number of bits of the flash ADC. Since the comparators can process an input signal concurrently, conventional flash ADCs are desirable for high-speed applications. However, as the resolution of the flash ADC increases to accommodate high-speed applications, so does the number of comparators, the die area and the power consumption needed to accommodate the comparators. For example, while a four-bit flash ADC typically needs only 15 comparators, a eight-bit flash ADC typically requires 255 comparators.

SUMMARY

Systems, methods and computer program products for correcting polarity decision associated with a polarity comparator in an analog-to-digital converter are described. The polarity comparator can perform polarity decision to determine whether an analog signal is greater or smaller than zero. If the voltage difference is greater than zero, then the analog signal can be output to other comparators without polarity inversion. If the voltage difference is smaller than zero, then the signal polarity of the analog signal can be inverted before being output to other comparators. One or more redundant comparators also can be used to correct offsets of the polarity comparator to reduced errors associated with the polarity decision.

In some implementations, a method can be used that includes receiving an analog input signal, making a polarity decision with respect to the analog input signal, and processing the analog input signal based on the polarity decision. In some implementations, the analog input signal is processed based on the polarity decision including comparing the analog input signal by a first set of comparators with one or more first reference levels, generating a code based on the comparison, and generating a digital output that corresponds to the analog input signal based on the code and the polarity decision.

In some implementations, the polarity decision can be made that includes determining whether a voltage level of the analog input signal exceeds a threshold voltage level. The polarity of the analog input signal can be inverted if the voltage level does not exceed the threshold voltage level. The analog input signal can be passed without polarity inversion if the voltage level exceeds the threshold voltage level.

In some implementations, the analog input signal can further be processed that includes comparing the analog input signal with one or more second reference levels. In some implementations, at least one of the second reference levels has an inverted relationship with respect to at least one of the first reference levels. In some implementations, the code can be generated that includes generating the code based on the comparisons performed with respect to the one or more first reference levels and the one or more second reference levels.

In some implementations, the digital output can be generated that includes converting the code to a signed binary code, and outputting the signed binary code as the digital output.

In some implementations, the code can be converted to the signed binary code by inverting a most significant bit of the code with remaining bits of the code unchanged if a voltage level of the analog input signal exceeds a threshold voltage level, and inverting all bits of the code other than the most significant bit and adding one to the inverted bits if the voltage level of the analog input signal does not exceed the threshold voltage level.

In some implementations, a system can be used that includes an input stage to receive an analog input signal, the input stage including a polarity comparator to make a polarity decision and to invert a polarity of the analog input signal based on the polarity decision, and an analog-to-digital conversion stage including a first set of comparators associated with one or more first reference levels and a second set of comparators associated with one or more second reference levels to make one or more comparator decisions based on the analog input signal, at least one of the one or more second reference levels having an inverted relationship with respect to at least one of the one or more first reference levels.

In some implementations, the polarity comparator can invert the polarity of the analog input signal when the analog input signal meets or exceeds a threshold voltage. In some implementations, the polarity comparator can pass the analog input signal to the analog-to-digital conversion stage without inverting the polarity of the analog input signal when the analog input signal does not exceed the threshold voltage.

In some implementations, the input stage can include a first sample and hold stage and a second sample and hold stage configured to allow the polarity decision to be made by the polarity comparator one cycle ahead of the one or more comparator decisions made by the first set of comparators and the second set of comparators.

In some implementations, the input stage can further include a polarity multiplexer coupled to the polarity comparator to provide the analog input signal with the inverted polarity to the first set of comparators and the second set of comparators based on outputs of the first sample and hold stage and the second sample and hold stage.

In some implementations, the analog-to-digital conversion stage can be configured to generate a code based on the one or more comparator decisions. The analog-to-digital conversion stage can further include a thermometer encoding stage configured to generate a binary code based on the code.

In some implementations, the analog-to-digital conversion stage can further include a code conversion stage to convert the binary code to a signed binary code.

In some implementations, the code conversion stage can be configured to generate the signed binary code by inverting a most significant bit of the binary code with remaining bits of the binary code unchanged if the analog input signal exceeds a threshold voltage level, and inverting all bits of the binary code other than the most significant bit and adding one to the inverted bits if the analog input signal does not exceed the threshold voltage level.

In some implementations, a device includes an array of comparators to receive an analog input signal having been processed based on a polarity decision, and to generate a code based on the analog input signal, the array of comparators including a first set of comparators associated with a first reference level, and a second set of comparators associated with a second reference level, the second reference level having an inverted relationship with respect to the first reference level, and an encoder to convert the analog input signal to a digital output.

In some implementations, the device can further include a bubble correction module to remove bubble errors in the code, and to forward the code free of bubble errors to the encoder.

In some implementations, the device can further include a code conversion module to convert the digital output to a signed binary code.

The details of one or more implementations of the invention are set forth in the accompanying drawings and the description below. Other features, objects, and advantages of the invention will be apparent from the description and drawings, and from the claims.

DESCRIPTION OF DRAWINGS

FIG. 3 shows an example of a sample and hold circuit.

FIGS. 4A and 4B each show an example of a unity gain buffer.

Like reference symbols in the various drawings indicate like elements.

DETAILED DESCRIPTION

Flash ADC Overview

Analog-to-digital converters (ADCs) allow the use of sophisticated digital signal processing systems to process analog signals. High-speed ADCs can be critical components of digital signal processing systems. Flash ADCs are one type of ADC commonly used in high speed signal applications. Generally, flash ADCs are implemented with voltage comparators that compare an input voltage to a set of nominally evenly spaced reference voltages. Ideally, a voltage comparator generates a digital HIGH output voltage when the voltage difference between the input voltage and the reference voltage is greater than zero, and a digital LOW output voltage if the difference is less than zero.

Figure 1:
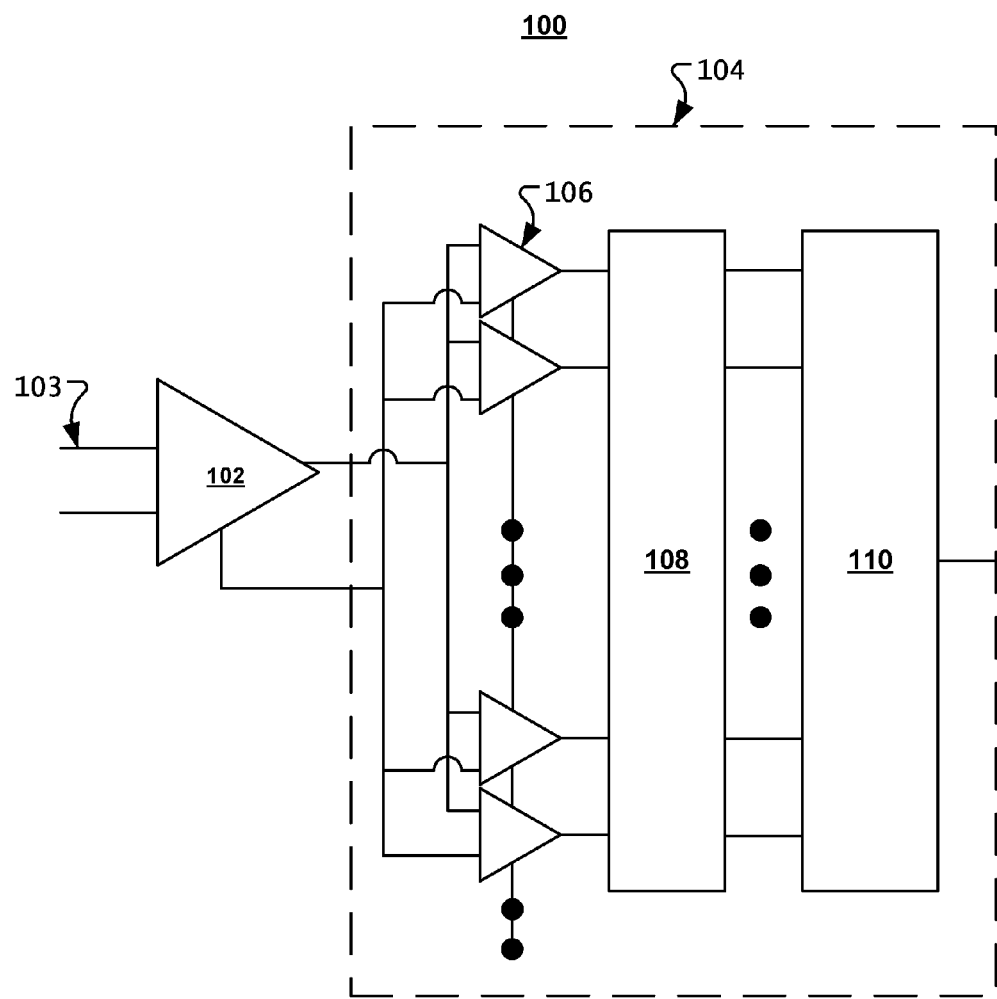
FIG. 1 shows an example of a conventional flash ADC system.

FIG. 1 shows an example of a conventional flash ADC system 100. Referring to FIG. 1, the flash ADC system 100 includes a gain buffer 102 and a n-bit resolution flash ADC 104. The n-bit resolution flash ADC 104 can include ($2^n$-1) number of voltage comparators 106, where "n" represents the number of output bits in the digital value generated by the flash ADC 104. As an example, an ADC with a resolution of eight bits can encode an analog input signal to one of 255 different levels (because $2^8-1=255$). The different levels can represent a range from 0 to 254 (e.g., as unsigned integers) or from -127 to 127 (e.g., as signed integers), depending on a particular design application.

The gain buffer 102 can be used to increase the size of the least significant bit (LSB) of the flash ADC 104 and to relax the design constraint on the flash ADC 104. The gain buffer 102 need not be part the flash ADC 104, and can be omitted in certain design applications. In the flash ADC system 100, the voltage comparators 106 of the flash ADC 104 can make comparative decision with respect to the analog input signal 103 in each clock cycle. The flash ADC system 100 can include a bubble error correction module 108. The bubble error correction module 108 can be used to supply a thermometer code free of bubble errors to the thermometer code to binary code conversion module 110 to generate a final binary output. The final binary output can be encoded to provide a n-bit digital word such that the n-bit digital word can represent the input analog signal 103 relative to the reference voltages of the reference ladders (i.e., the comparators).

In the flash ADC 104, each voltage comparator 106 can be used for comparing the analog input signal 103 to one or more threshold reference voltages. A voltage comparator 106 can generate a logical ONE or digital HIGH when the output of the voltage comparator 106 exceeds its threshold (e.g., larger than zero), and a logical ZERO or digital LOW when the output of the voltage comparator 106 is below the threshold (e.g., less than zero). An array of latches (e.g., sampling/hold circuits) can be used to determine the logical state of the voltage comparators 106 during each clock cycle, and to hold this information until sampling during the succeeding cycle, as will be discussed in greater detail below.

As discussed above, one or more voltage comparators 106 can be used for each possible output code bit so as to increase the overall processing speed of the flash ADC 104. However, because the number of voltage comparators 106 grows exponentially (e.g., based on the number of output bits "n") with the resolution of the flash ADC 104, additional circuitry and connection lines are necessary in the flash ADC 104, which can increase power consumption and the integrated circuit (IC) chip area. These characteristics can render flash ADC 104 undesirable compared to other types of ADCs, particularly for low power portable applications that require high speed and high resolution.

Folding Flash ADC

One technique to decrease the number of components required within the flash ADC 104, and particularly the number of voltage comparators 106 without requiring multiple conversion cycles, may be effected through a "folding" technique. The folding technique may be used to reduce the size of the flash array (e.g., by reducing the number of voltage comparators 106) necessary to implement a converter of a given precision by using the flash array in an efficient manner. Specifically, a folding ADC may include a flash array and a decoder to generate the most significant bits (MSBs) of an output value, and a folder circuit may be added that precedes the flash array to effectively subtract the amount of voltage represented by the MSBs from the analog input signal to provide a remainder voltage that precisely corresponds to the least significant bits (LSBs) of the output value.

One advantage associated with the use of a folding ADC lies in the high sample rate, in combination with low power consumption and small chip area. The folding ADC requires little power to drive the input compared to other types of ADCs. The power consumed by the reference ladder of the folding ADC is also relatively low. Since folding ADCs require a relatively low number of comparators, folding ADCs are well suited in high-speed and high-resolution applications.

For folding ADCs with a folding rate larger than two (e.g., >2×), complicate analog folding circuits and operations are generally required. The analog folding circuits also demand large power consumption and die chip area, and generate signal distortion that limits the available bandwidth of the ADCs, rendering the use of such folding ADCs undesirable. For folding ADCs with a folding rate equal to two (e.g., 2×), the analog folding operation is generally simpler than that of the folding ADCs with a folding rate larger than two because signal inversion based on signal polarity can be used. For example, for a fully differential signal, signal inversion entails only the inverting of the positive and negative polarity sign at the output, which can be performed by a multiplexer. Hence, polarity inversion for 2× folding rate ADCs requires little power or die area, and can be carried out with minimal distortion compared to other types of folding ADCs. There is one disadvantage to the 2× folding rate ADCs, however. Because the swapping sign operation is based on the signal polarity and affects all subsequent comparator decisions following the sign swapping multiplexer, the polarity decision need to be made before the LSB can be determined. Thus, without appropriate track and hold operations, this requirement can limit the ADC conversion rate of 2× folding rate ADCs. Further, in high speed and high resolution ADC applications, 2× folding rate ADCs are subject to missing code(s) around the center of the input signal 103 (e.g., around zero of the input differential signal).

As will be described in greater detail below, an ADC (e.g., with 2× folding rate) with an ADC architecture that includes appropriate track and hold operations to improve ADC conversion rate can be used. The ADC can further include a redundancy architecture to remove or substantially minimize errors and missing code around the center of the signal.

Figure 2:
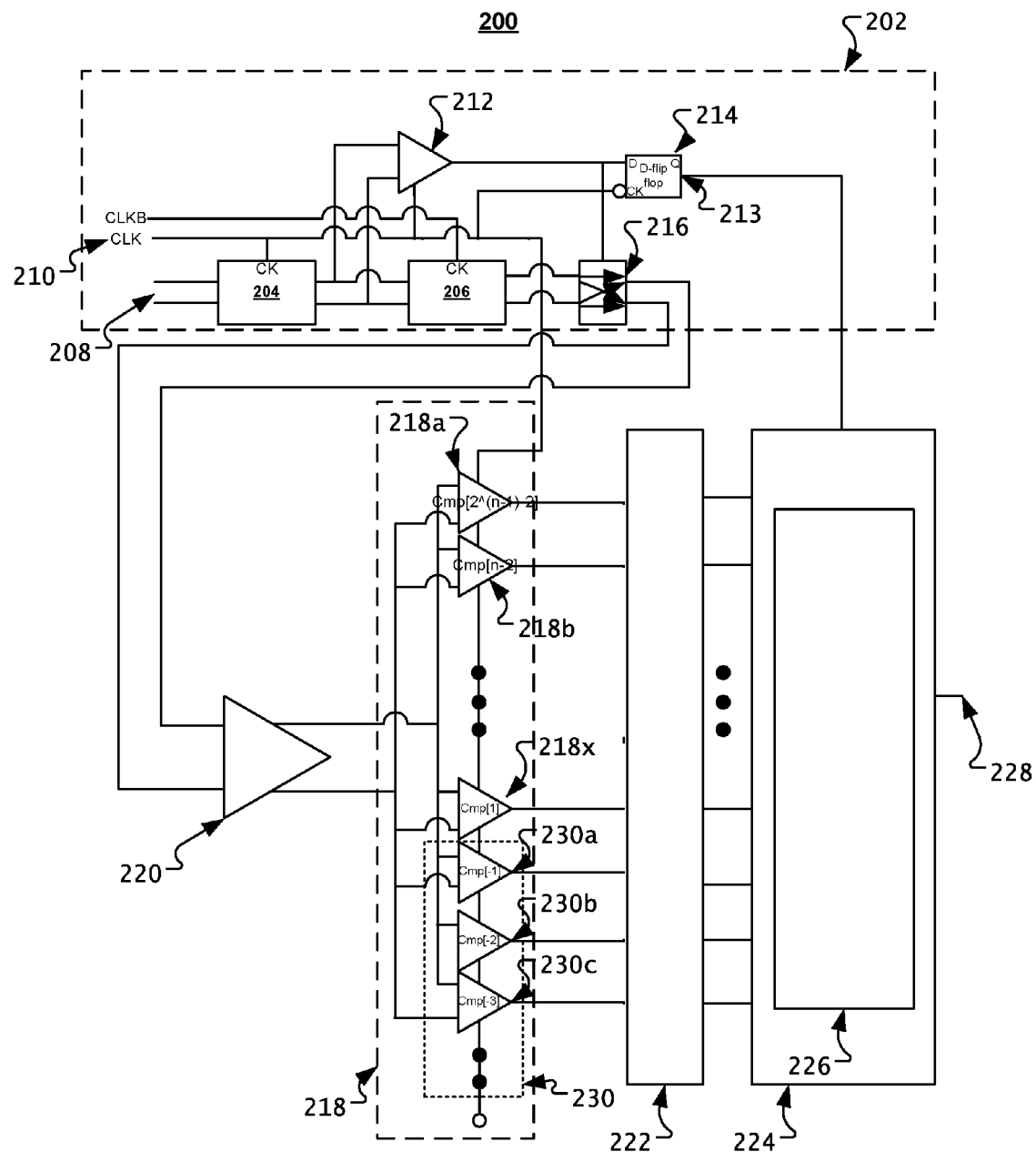
FIG. 2 shows an example of a flash ADC.

FIG. 2 shows an example of a flash ADC 200 implemented with a redundancy architecture. The flash ADC 200 can include an input stage 202. The input stage 202 can include a first sample and hold stage 204 and a second sample and hold stage 206 to sample the input differential signal 208 and to hold the sampled signals in response to the clock signals 210. Specifically, the first sample and hold stage 204 can sample the input differential signal 208 based on the clock signals CLK/CLKB 210. The polarity comparator 212 can detect whether the input differential signal 208 is greater or smaller than a predetermined threshold level.

For example, the polarity comparator 212 can detect whether the input differential signal 208 is greater or smaller than zero. If the voltage difference between the input voltage and the reference voltage is greater than zero, then the input differential signal 208 can be output to other comparators (e.g., array of comparators 218) without polarity inversion. If the voltage difference between the input voltage and the reference voltage is smaller than zero, then the signal polarity of the input differential signal 208 can be inverted before being output to the array of comparators 218. Ideally, if there is no error in the foregoing polarity decision process, the input differential signal 208 presented after the polarity swap multiplexer 216 (configured to change the polarity of the input differential signal 208) should generally be positive. This positive signal can represent half of the ADC range, and require only $2^{n-1}-2$ comparators to be detected.

The first sample and hold stage 204 and the second sample and hold stage 206 can be employed to carry out the polarity decision process one cycle prior to other comparator decisions. Specifically, the first sample and hold stage 204 and the second sample and hold stage 206 can allow the polarity decision to be performed one cycle ahead of other comparator decisions. For example, the processing time and the delay associated with the polarity comparator 212 in generating a polarity decision can prolong the process for producing the necessary polarity decision needed to determine the inputs of the comparators 218 and the final digital values at the output 228. In this example, the first sample and hold stage 204 and the second sample and hold stage 206 each can receive the input differential signal 208 to be sampled and held while the polarity decision and signal swapping are performed. In doing so, the first sample and hold stage 204 and the second sample and hold stage 206 can reduce the clock period requirement, which can further achieve high speed operations and improve the ADC conversion rate.

Depending on a specific design and application, a greater or lesser number of sample and hold stages than those shown can be used. For example, only one sample and hold stage can be implemented. However, it could increase the clock period requirement with only one sample and hold stage rather than two or more sample and hold stages to track and hold the input differential signal 208 for the same delay associated with the polarity comparator 212. As another example, additional sample and hold stages (e.g., in addition to the first sample and hold stage 204 and the second sample and hold stage 206) can be added to accommodate any additional delay or processing time associated with the polarity comparator 212, the polarity swap multiplexer 216, and/or the gain buffer 220.

In sum, implementing a polarity decision process using the polarity comparator 212 can help reduce the number of comparators needed in the flash ADC 200. This is because polarity swap allows, for example, negative signed integers of the input differential signal 208 to remain in the positive range so that only half as many comparators are needed to process the input differential signal 208.

In some implementations, the first sample and hold stage 204 and the second sample and hold stage 206 can be implemented with a switched-capacitor circuit in which a sampling capacitor is switched between sampling and hold modes.

During the sampling mode, the input differential signal 208 can be sampled onto a sampling capacitor, and during the hold mode, the charge on the sampling capacitor can be transferred to a holding capacitor. FIG. 3 shows an example of a sample and hold circuit 300 that can be used as the first sample and hold stage 204 and/or the second sample and hold stage 206.

Referring to FIG. 3, the sample and hold circuit 300 can include an input buffer stage 302, a switching stage 304, a holding capacitor stage 306, and an output buffer stage 312. The input buffer stage 302 can include a differential buffer amplifier 303. In some implementations, the differential buffer amplifier 303 can be a unity gain buffer amplifier for replicating the differential analog input signals 308a/308b. During the track (or sampling) mode operation, the differential buffer amplifier buffer 303 can provide a differential current to charge the holding capacitors 306a/306b. The capacitor voltage can be replicated when the switches 304a/304b are open. In the hold mode, voltages can be held in the holding capacitors 306a/306b. Referring again to FIG. 2, sampled signal from the first sample and hold stage 204 can pass to the second sample and hold stage 206, and sampled signal from the second sample and hold stage 206 can pass to the polarity swap multiplexer 216. The polarity swap multiplexer 216 then can determine whether to change the polarity of the input differential signal 208. In some implementations, the determination can depend on the output of the polarity comparator 212.

Figure 5:
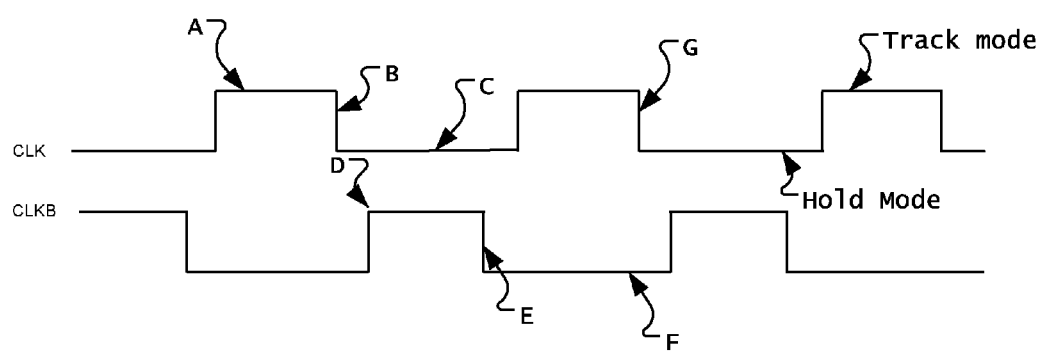
FIG. 5 shows an example timing diagram of a sample and hold stage.

FIGS. 4A and 4B each show an example of a unity gain buffer. The unity gain buffer can be implemented using, for example, source follower or emitter follower configuration. The unity gain buffer 402 shown in FIG. 4A and the unity gain buffer 404 shown in FIG. 4B can include one or more active elements such as bi-polar transistors or field-effect transistors (FET) to provide a gain of one to the input signal(s) (e.g., with no amplification). To reduce the overall chip area of the flash ADC 200, it is desirable that an FET be used. Where FETs are used, the FETs can be connected in a source follower arrangement where the buffer input is the gate of the FET and the buffer output is the source of the FET. The FET drain can be connected to a fixed voltage source. In such an ideal buffer, gain is equal to unity. FIG. 5 shows an example timing diagram of a sample and hold stage. The timing diagram will be explained in conjunction with FIG. 2.

Referring to FIG. 5, when the clock signal CLK (e.g., clock signal 210) is logic HIGH (indicated as "A"), the first sample and hold stage 204 begins to track (or sample) the input differential signal 208. At the falling edge of the clock CLK (indicated as "B"), the input differential signal 208 can be sampled into the first sample and hold stage 204 as sampled signal D(i). Concurrently or sequentially, the polarity comparator 212 can perform decision making with respect to the signal D(i) at the rising edge of the complementary clock CLKB (which denotes a non-overlap complementary of the clock CLK). The polarity comparator 212 can determine whether to change the polarity of the input differential signal 208 at the output of second stage sample and hold stage 206. During the period at which the clock CLK is LOW (indicated as "C"), the first sample and hold stage 204 can hold the value of the sampled signal D(i).

During the period in which the complementary clock CLKB is HIGH (indicated as "D") the sampled signal D(i) in the first sample and hold stage 204 can be tracked by the second sample and hold stage 206. At the falling edge of the complementary clock CLKB (indicated as "E"), the sampled signal D(i) can be sampled into the second sample and hold stage 206. During the period in which the complementary clock CLKB is LOW (indicated as "F"), the sampled signal D(i) can be held at the second sample and hold stage 206.

In some implementations, the regeneration time of the polarity comparator 212 can be sufficiently fast such that the sampled signal D(i) can fully settle to meet the ADC resolution requirement after changing the polarity of the input differential signal 208 at the output of the second sample and hold stage 206 and the polarity swap multiplexer 216. In these implementations, the comparator decision associated with the array of comparators 218 following the gain buffer 220 can occur one cycle after the input differential signal 208 is sampled into the first sample and hold stage 204 (indicated as "G").

In some implementations, a D-flip flop 214 can be coupled to the output of the polarity comparator 212. The D-flip flop 214 can delay the polarity decision of the sampled signal D(i) at the output 213 by one cycle so that the polarity decision can be latched and used to construct the final signed binary output with the comparator decisions associated with the array of comparators 218.

If more settle time is needed by the gain buffer 220, as discussed above, one or more additional sample and hold stages can be added before the polarity swap multiplexer 216. In these implementations, the sampled signal D(i) decision associated with the array of comparators 218 following the gain buffer 220 can occur half or more cycle later at the falling edge of CLK. Accordingly, additional latches can be added to help synchronize the polarity decision at the output 213 of the D-flip flop 214 with comparator decisions generated by the array of comparators 218 to construct the final ADC output signed code at the output 228.

As discussed above, the input differential signal 208 at any given moment of sampling can be applied in parallel to the array of comparators 218 for comparing the input differential signal 208 to a set of reference voltage levels. Typically, the array of comparators 218 associated with a reference voltage level higher than the input differential signal 208 can output a logical zero (e.g., where all the bits above a particular comparator whose reference is the first to exceed the signal value), while the comparators associated with a reference voltage level lower than the input differential signal 208 can output a logical one (e.g., where all the bits below a particular comparator whose reference is the first to exceed the signal value). The array of comparators 218 can convert the input differential signal 208 into a coded sample of the form such as "0001111", which is known as the thermometer code. The first bit of the thermometer code can be defined as the output of the comparison between the input differential signal 208 and the lowest reference voltage. If the input differential signal 208 is less than the $(n+1)^{th}$ reference voltage, a one-to-zero transition occurs at the $n^{th}$ bit of the thermometer code. Subsequently, the thermometer code can be encoded into a binary code by the thermometer code to signed binary code conversion module 224. The thermometer code to signed binary code conversion module 224 can include a code conversion module 226 to generate the final ADC output signed code at the output 228.

In some cases, the real-time conversion of the thermometer code into binary code may not be accurate due to the occurrence of bubbles (e.g., a false 0 or 1). Using the example provided above, the comparators may output a thermometer code such as "0010111" (as opposed to "0001111"). A bubble may be very small and affect only one thermometer digit very close to the boundary between the zeros and the ones. Nevertheless, the position of the bubble is critical, and a small bubble can cause a disproportionately large error at the output. Accordingly, in some implementations, a bubble correction module 222 can be added to the flash ADC 200. Specifically, the bubble correction module 222 can precede the thermometer code to signed binary code conversion module 224 to receive the thermometer code from the array of comparators 218. The bubble correction module 222 can identify any bubble, and execute simple logic to correct the identified bubble before forwarding the thermometer code to the thermometer code to signed binary code conversion module 224.

Another source of error in the flash ADC 200 is the polarity comparator 212. Ideally, the comparison threshold between the input voltage and the reference voltage is zero. However, device mismatches and mechanical imperfection in the fabrication process can cause voltage comparators to deviate from the zero level by an offset voltage. This phenomenon can cause significant error in flash ADCs. An offset can give rise to polarity decision error. Where a polarity decision error is present, the polarity decision error could be amplified by the gain buffer 220. The polarity decision error also could become dominant when the offset associated with the second sample and hold stage 206, the gain buffer 220, and the polarity comparator 212 are significant to become the DC offset for the polarity decision error.

Yet another source of error in the flash ADC 200 can be attributed to the instability associated with sampling a high frequency input signal while attempting to perform a polarity decision by the polarity comparator 212. The instability can be caused by the high speed operation in sampling the high frequency input signal and generating a polarity decision at the same instant. For wide bandwidth input signals, if the polarity comparator 212 lacks sufficient bandwidth, polarity decision offset can result. This is because the flash ADC 200 acts on the input differential signal 208 quickly, causing the decision of the polarity comparator 212 and the sampled signal at the first sample and hold stage 204 to be different in values and spaced in time with respect to the original input signal.

To compensate for these errors, in some implementations, offset calibration can be performed. For example, calibration can be performed with the clocked portion of the flash ADC 200 held in a fixed state, while the offset of the front end components (e.g., the first sample and hold stage 204, the second sample and hold stage 206, the gain buffer 220, and the polarity comparator 212) is adjusted in response to the result of a DC comparison between the output and the reference voltage. In some implementations, the offset associated with the gain buffer 210, the first sample and hold stage 204 and the second sample and hold stage 206 can be calibrated. During calibration, the input of the first sample and hold stage 204 can be shorted (e.g., split from the signal path) so that the offset associated with the first and second sample and hold stages 204/206 and the gain buffer 220 can be corrected. After calibration, the offset associated with the gain buffer 220, the first sample and hold stage 204 and the second sample and hold stage 206 can be corrected to match the ideal DC zero level. Similarly, the polarity comparator 212 also can be calibrated to allow the offset associated with the polarity decision to be corrected. For example, similar to the calibration process for calibrating the gain buffer 220, the first sample and hold stage 204 and the second sample and hold stage 206 discussed above, the input of the first sample and hold stage 204 can be shorted to allow the offset associated with the polarity comparator 212 to match the ideal DC zero level after calibration.

The offset associated with each comparator in the array 218 also can be calibrated. In some implementations, a subset of selected comparators can be calibrated while the remaining comparators remain operational. In other implementations, all of the comparators in the array 218 can be calibrated simultaneously. In other implementations, the offset associated with the polarity comparator 212 can be calibrated. During this calibration, the input of the first sample and hold stage 204 can be shorted so that the offset of the first sample and hold stage 204 and the polarity comparator 212 can be corrected.

Folding Rate of the Flash ADC

As discussed above, low cost, relatively high speed ADCs have become critical building blocks for digital signal processing and video applications. By way of example, flash ADCs implemented in CMOS have been developed that are straightforward in design and are capable of high speed operation. Typically, in each cycle, n-bit digitization process requires that an input signal be sent to $2^n-1$ comparators for each output (typically $2^n-2$ comparators are used). Hence, one drawback with conventional flash ADCs is that the number of comparators can grow exponentially with the number of bits. Increasing the quantity of the comparators also increases the area of the overall circuit, as well as power consumption. As an example, an eight-bit flash ADC requires 255 ($2^8-1=255$) comparators, which would require a large die size, and power consumption.

Accordingly, in some implementations, the number of comparators can be limited to $2^{n-1}-2$ comparators in addition to the polarity comparator 212 (e.g., $1+2^{n-1}-2$). In some implementations, a predetermined number "m" (where m=0, 1, 2, 3, . . . ) of redundant comparators also can be added (e.g., $1+2^{n-1}-2+m$) to correct any error that arises from the polarity decision offset, as will be discussed in greater detail below.

During operation, the polarity comparator 212 can determine whether the input differential signal 208 (e.g., difference between the analog input signal and the reference voltage) is larger or smaller than zero. If the input differential signal 208 is larger than zero, the input differential signal 208 is passed to the array of comparators 218 without polarity inversion. If the input differential signal 208 is smaller than zero, the polarity can be inverted before the input differential signal 208 is passed to the array of comparators 218. If there is no error in polarity decision, then the input differential signal 208 presented after the polarity swap multiplexer 216 is positive. By inverting the polarity associated with the input differential signal 208 (e.g., by inverting a negative differential signal to a positive differential signal), the number of comparators required for processing the input differential signal 208 can be significantly reduced because the output is ensured to be the same sign (e.g., always be a positive signal). This positive signal can represent half of the ADC range and require only $2^{n-1}-2$ comparators to be detected and processed.

Generally, the voltage difference defines the voltage resolution of the least significant bit (LSB). Typically, the reference voltage for each comparator in the array 218 is at least one LSB greater than the reference voltage for the comparator immediately below it. For example, the reference voltage associated with comparator 218a is at least one LSB greater than the reference voltage associated with comparator 218b. As another example, the reference voltage associated with comparator 218b is at least one LSB greater than the reference voltage associated with comparator 218x. Each comparator produces a logical one when the analog input voltage is higher than the reference voltage. Otherwise, the comparator outputs a logical zero. Thus, if the analog input signal is between the threshold voltage associated with two adjacent comparators, then the lowest one of those comparators (e.g., comparator 218x) outputs a logical one and all of the lower comparators output a logical zero. The point where the code changes from ones to zeros is the point where the input signal becomes smaller than the respective comparator reference voltage levels.

Assuming the dynamic range of the flash ADC 200 $V_{ADC}$ is from $-V_{ref}$ to $+V_{ref}$, in some implementations, the LSB can be determined by [1]:

$$\text{LSB} = 2 * V_{ref}/2^n \qquad [1]$$

where "n" represents a number of bits generated by the flash ADC 200. Where $(2^{n-1}-2)$ comparators are used by the flash ADC 200, each of the $(2^{n-1}-2)$ comparators can be associated with a different reference voltage $V_{ref}$. For example, the first comparator Cmp $[2^{n-1}-2]$ (e.g., comparator 218a) can be associated with a reference level $V_{ref}$ of $[2^{n-1}-2-0.5]*\text{LSB}$. In this example, the reference voltage level for the polarity comparator 212 can be defined as zero. TABLE 1 shows a comparator table illustrating the reference voltage level associated with each comparator in the array 218.

TABLE 1

| Comparator | Reference Voltage Level |
|---|---|
| Cmp $[2^{n-1} - 2]$ | $[2^{n-1} - 2 - 0.5] * \text{LSB}$ |
| ... | ... |
| Cmp [3] | 2.5 * LSB |
| Cmp [2] | 1.5 * LSB |
| Cmp [1] | 0.5 * LSB |

Code Conversion

The thermometer code output by the array of comparators 218 can be converted and encoded into signed binary code by the signed binary code conversion module 224 in proportion to the input differential voltage. The binary code generated by the thermometer code to signed binary code conversion module 224 can be an unsigned code. In some implementations, the thermometer code can be re-arranged such that its transitions are (e.g., as far as possible) away from the center. In these implementations, the thermometer code to signed binary code conversion module 224 can be used to convert the n-bit thermometer code to n-bit signed code to be output at output 228.

In some implementations, where the output of the polarity comparator 212 is logical one (Cmp_pol=1) (e.g., where the input differential signal 208 is larger than zero), then the thermometer code may be converted to the binary code according to TABLE 2. For example, where the thermometer code is "111 . . . 111", the signed code can be converted to "011 . . . 111" (which is $-2^{n-1}-1$). Where the output of the polarity comparator 212 is logical zero (Cmp_pol=0) (e.g., where the input differential signal 208 is smaller than zero), the input signal to the comparators 218 can be inverted. Then, the binary code can be generated as if the polarity comparator 212 is logical one. Subsequently, all the binary bits of the binary code can be inverted and one can be added to the inverted bits. The resulting binary code can then be used as the signed binary code when the output of the polarity comparator 212 is logical zero. As an example, where the thermometer code is "111 . . . 111" when the polarity bit is logical zero, the input signal to the comparators 218 can be inverted and the binary code "011 . . . 111" can be generated as if the polarity bit is logical one. Subsequently, one is added to the all-bit inverted code and the result is the signed binary code when the output of the polarity comparator 212 is logical zero (e.g., "100 . . . 000"+1) to provide "100 . . . 001" (e.g., which is $-2^{n-1}+1$), as shown in TABLE 2 below.

Figure 6:
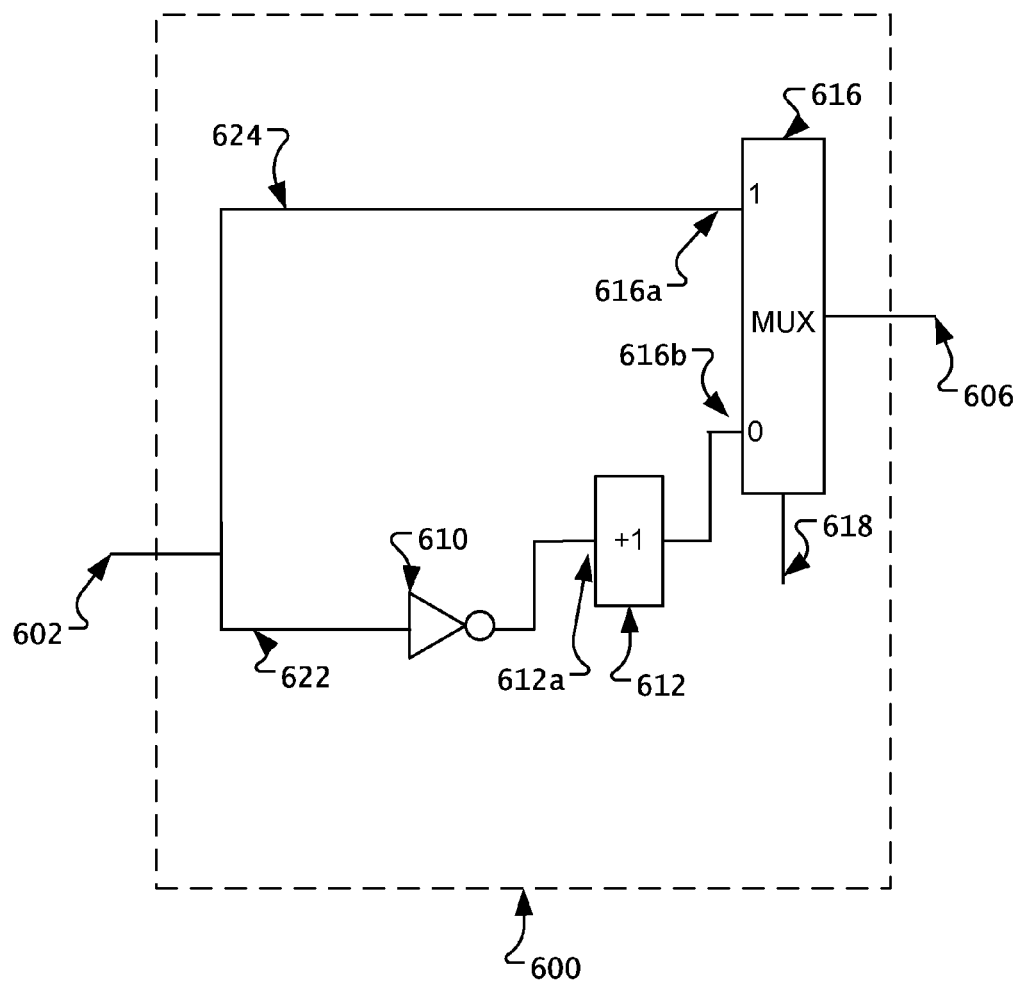
FIG. 6 shows a block diagram of an example code conversion module.

In some implementations, to convert the n-bit thermometer code to a n-bit signed code, the thermometer code to signed binary code conversion module 224 can include the code conversion module 226 to perform the conversion so as to provide the n-bit signed code at output 228. FIG. 6 shows a block diagram of an example code conversion module 600 that can be used as the code conversion module 226. The code conversion module 600 can receive an input from the thermometer code to signed binary code conversion module 224 and the polarity comparator 212 to generate the final ADC output at output 228 based on the polarity decision.

As shown in FIG. 6, the code conversion module 600 can receive an input 602 (e.g., via the input of the thermometer code to signed binary code conversion module 224). In some implementations, the thermometer code to signed binary code conversion module 224 may perform standard thermometer code to binary conversion regardless of whether the output of the polarity comparator 212 is logical one or zero. For example, the thermometer code to signed binary code conversion module 224 may perform code conversion in the manner specified in TABLE 2.

To determine the signed binary code at the output 606, the code conversion module 600 can receive an input 618. The input 618 may be coupled to the output of a polarity comparator (e.g., polarity comparator 212). When the polarity decision performed by the polarity comparator 212 indicates that the input differential signal 208 is smaller than zero (which means that Cmp_pol=0 and polarity inversion is needed), the multiplexer 616 receives a logical zero from the input 618, and outputs the signal received at the input 616b. Using the example above where the thermometer code "111 . . . 111" is received at the input 602, the multiplexer 616 outputs the signed code "100 . . . 001" at the output 606. Similarly, when the polarity decision performed by the polarity comparator 212 indicates that the input differential signal 208 is larger than zero (which means that Cmp_pol=1 and polarity inversion is not needed), a logical one is output to the multiplexer 616 through the input 618. The multiplexer 616 then outputs the signed code "011 . . . 111" at the output 606. TABLE 2 shows an example of the thermometer binary code to signed binary code conversion block for an ideal polarity decision. The binary code for Cmp_pol=1 can be expressed as a function of $(2^{n-1}-1)$, while the binary code for Cmp_pol=0 can be expressed as a function of $(2^{n-1}+1)$.

TABLE 2

| Thermometer Code Cmp $[(2^{n-1} - 2):1]$ | Cmp_pol = 1 | Cmp_pol = 0 |
|---|---|---|
| 111 . . . 111 | 011 . . . 111 | 100 . . . 001 |
| 011 . . . 111 | 011 . . . 110 | 100 . . . 010 |
| 001 . . . 111 | 011 . . . 101 | 100 . . . 011 |
| ... | ... | ... |
| ... | ... | ... |
| 000 . . . 011 | 000 . . . 010 (2) | 111 . . . 110 (−2) |
| 000 . . . 001 | 000 . . . 001 (1) | 111 . . . 111 (−1) |
| 000 . . . 000 | 000 . . . 000 (0) | 000 . . . 000 (0) |

Figure 7B:
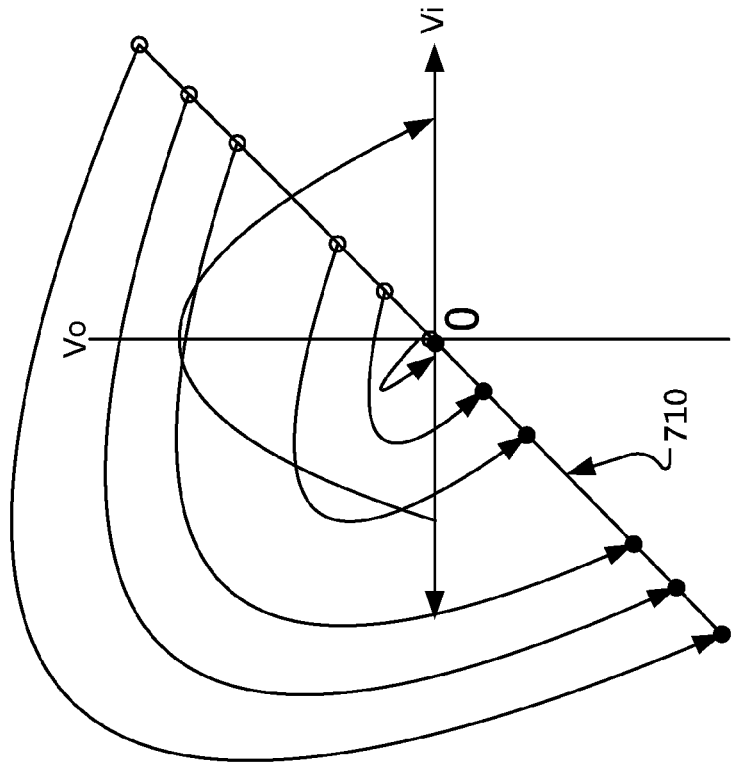
FIG. 7B shows an ADC transfer function with ideal polarity decision zero offset when the polarity decision is logical zero.
Figure 7A:
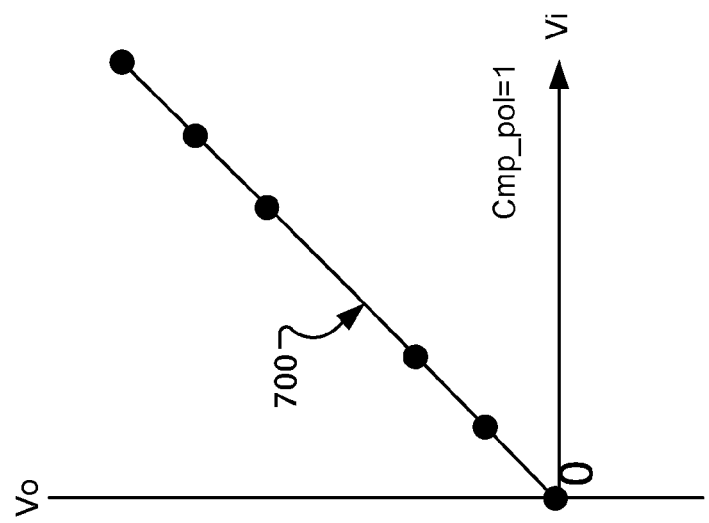
FIG. 7A shows an ADC transfer function with ideal polarity decision zero offset when the polarity decision is logical one.

FIG. 7A shows an ADC transfer function 700 with ideal polarity decision zero offset when the polarity decision is logical one (Cmp_pol=1). As shown in FIG. 7A, the ADC transfer function 700 maps the initial digital signals ($V_o$) that are generated in response to the input analog signals ($V_i$). The ADC transfer function 700 exhibits an ideal linear shape across the dynamic range of the input analog signals ($V_i$) when the polarity decision is logical one.

FIG. 7B shows an ADC transfer function 710 with ideal polarity decision zero offset when the polarity decision is logical zero (Cmp_pol=0). As shown, even though there are only comparators with reference levels in the positive signal range, the signal polarity inversion combined with the signed code conversion based on the polarity decision can generate correct negative code for signals in the negative voltage range.

Figure 7C:
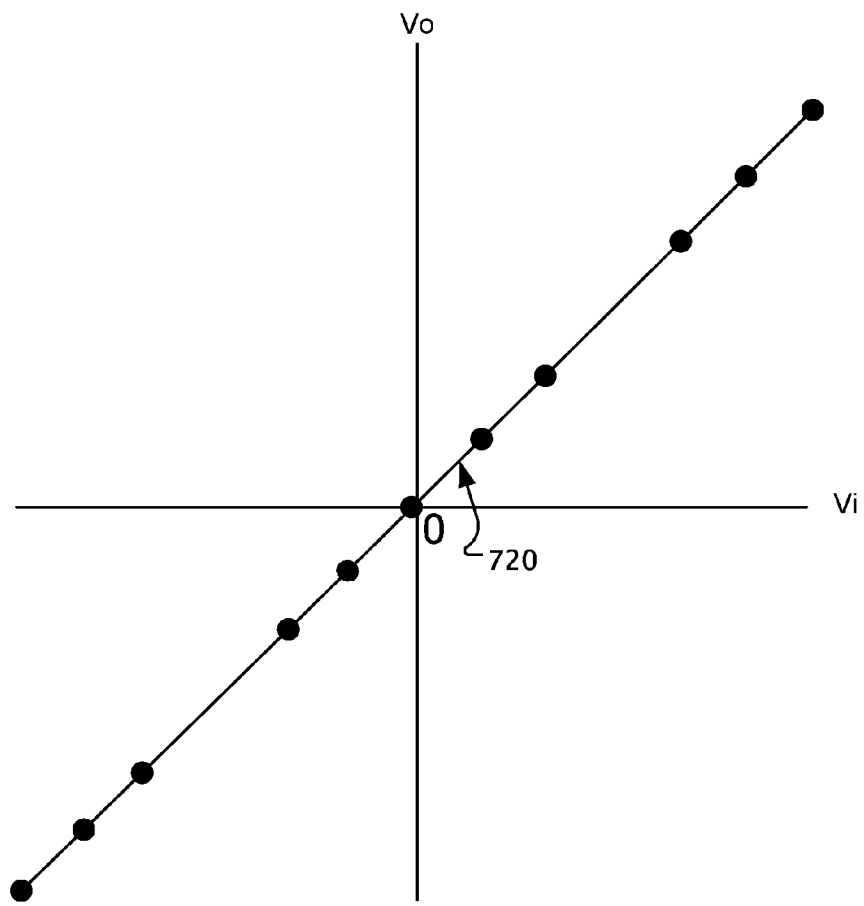
FIG. 7C shows a combined ADC transfer function with ideal zero offset.

FIG. 7C shows a combined ADC transfer function 720 with ideal zero offset. As shown in FIG. 7C, the ADC transfer function 720 combines the ADC transfer function 700 with ideal zero offset when the polarity decision is logical one with the ADC transfer function 710 with ideal zero offset when the polarity decision is logical zero. From the combined ADC transfer function 720, it is apparent that the flash ADC 200 has quantized the input analog signal to a resolution of a LSB.

Error from Polarity Decision Offset

As discussed previously, a flash ADC (e.g., flash ADC 200) can be utilized to convert high frequency analog data. In order to accurately convert the high frequency analog data, it is desirable that the comparators exhibit little electrical variation from ideal operation even in the presence of offsets. Many sources exist for offsets including mismatch between two devices (e.g., transistors, resistors, capacitors, etc.) due to limitations of and imperfections in fabrication processes as well as processing delay between different ADC components. Polarity comparators (e.g., polarity comparator 212) also may exhibit certain degree of offset from the ideal zero decision level. If a polarity decision has an offset more than half of a LSB, missing code may result. Further, the offsets also may be attributed to other components of the flash ADC, such as gain buffers. These offsets may be combined to generate an error $V_{os}$ that could affect the polarity decision. While calibration or auto zero techniques may be used to reduce the error $V_{os}$ generated by the some offsets, these techniques may not necessarily be effective for other offsets generated by different sources or components. For example, calibration or auto zero techniques can remove or substantially reduce DC offsets caused by DC sources, but are not effective to reduce AC offsets. These techniques become inadequate and ineffective in cases where AC offsets are greater in proportional to DC offsets in the combined offsets. High resolution and high speed applications could cause additional offsets. As an example, an insufficient bandwidth of a polarity comparator could result in a decision offset from the ideal zero level for a high frequency input signal, and subsequent components (e.g., gain buffers) could amplify this offset error to generate an even larger error.

Even if the polarity comparator and the gain buffer are calibrated and auto zeros are performed, there is no guarantee that the polarity decision error could be reduced to below the half-LSB level, which can distort and cause missing codes in the digital output of the flash ADC. The missing codes and distortion are particularly dominant in the center of an input signal. In most signal processing systems, the center of the input signal level carry most of the critical information related to the signal value decision and timing position decision. Hence, the system performance could be greatly degraded if the missing codes and the distortion are not corrected.

In some implementations, a predetermined number "m" (where m=0, 1, 2, 3, . . . ) of redundant comparators can be added to the existing array of comparators 218 (e.g., which gives a total number of comparators of $2^{n-1}-2+m$) to correct the error $V_{os}$ that arises due to the polarity decision offset. For example, the one or more redundant comparators can be added to correct the code error associated with the polarity decision offset.

TABLE 3 shows a comparator table illustrating the reference voltage level associated with each comparator including the redundant comparators. As shown in TABLE 3, the reference voltage level associated with the redundant comparators Cmp[-1] . . . Cmp[-m] may be in an inverted relationship with respect to the reference voltage level associated with comparators Cmp[$2^{n-1}$-2] . . . Cmp[1]. For example, the reference voltage level (0.5*LSB) of the comparator Cmp[1] and the reference voltage level (-0.5*LSB) of the redundant comparator Cmp[-1] have an inverted relationship.

TABLE 3

| Comparator | Reference Voltage Level |
|---|---|
| Cmp [$2^{n-1}$ - 2] | [$2^{n-1}$ - 2 - 0.5] * LSB |
| ... | ... |
| Cmp [3] | 2.5 * LSB |
| Cmp [2] | 1.5 * LSB |
| Cmp [1] | 0.5 * LSB |
| Cmp [-1] | -0.5 * LSB |
| Cmp [-2] | -1.5 * LSB |
| Cmp [-3] | -2.5 * LSB |
| ... | ... |
| Cmp [m] | -(m - 0.5) * LSB |

The thermometer code output by the array of comparators 218 and the redundant comparators 230 (e.g., redundant comparators 230a-230c) can be converted and encoded into a binary code by the thermometer code to signed binary code conversion module 224 in proportion to the input differential voltage. With redundancy correction for errors generated in polarity decision, the code conversion process to convert a thermometer code to a signed code can be the same as that without redundancy correction as shown in TABLE 2. For example, where Cmp_pol=1, the thermometer code to signed binary code conversion is a regular one (as shown in TABLE 4 below). As another example, where Cmp_pol=0, the signal is inverted. Then, the binary code is generated as if the output of the polarity comparator 212 is logical one. Subsequently, all the binary bits of the binary code are inverted and one is then added to the inverted code. The resulting binary code is the signed binary code when the output of the polarity comparator 212 is logical zero. In these implementations, the binary code for Cmp_pol=1 also can be expressed as a function of ($2^{n-1}$-1), and the binary code for Cmp_pol=0 can be expressed as a function of ($-2^{n-1}$+1). The rule of conversion is shown in TABLE 4. Specifically, TABLE 4 shows an example of the thermometer code to signed binary code conversion block (e.g., as performed by the thermometer code to signed binary code conversion module 224 and the code conversion module 226/600).

TABLE 4

| Thermometer Code Cmp [($2^{n-1}$ - 2):1]:Cmp [-1:-m] | Cmp_pol = 1 | Cmp_pol = 0 |
|---|---|---|
| 111 . . . 111:11 . . . 11 | 011 . . . 111 | 100 . . . 001 |
| 011 . . . 111:11 . . . 11 | 011 . . . 110 | 100 . . . 010 |
| 001 . . . 111:11 . . . 11 | 011 . . . 101 | 100 . . . 011 |
| ... | ... | ... |
| ... | ... | ... |
| 000 . . . 011:11 . . . 11 | 000 . . . 010 (2) | 111 . . . 110 (-2) |
| 000 . . . 001:11 . . . 11 | 000 . . . 001 (1) | 111 . . . 111 (-1) |
| 000 . . . 000:11 . . . 11 | 000 . . . 000 | 000 . . . 000 |
| 000 . . . 000:01 . . . 11 | 111 . . . 111 | 000 . . . 001 |

TABLE 4-continued

| Thermometer Code Cmp $[(2^{n-1} - 2):1]$:Cmp $[-1:-m]$ | Cmp_pol = 1 | Cmp_pol = 0 |
|---|---|---|
| 000...000:00...11 | 111...110 | 000...010 |
| ... | ... | ... |
| ... | ... | ... |
| 000...000:00...11 | 111...000 | 000...110 (0) |

To illustrate the foregoing redundancy architecture, TABLE 5 shows a 6-bit folding rate flash ADC with three redundant comparators (e.g., m=3):

TABLE 5

| Cmp [31:1]:Cmp [−1:−3] | Cmp_pol = 1 | Cmp_pol = 0 |
|---|---|---|
| 111...111:111 | 011111 (+31) | 100001 (−31) |
| 011...111:111 | 011110 (+30) | 100010 (−30) |
| 001...111:111 | 011101 (+29) | 100011 (−29) |
| ... | ... | ... |
| ... | ... | ... |
| 000...011:111 | 000010 (+2) | 111110 (−2) |
| 000...001:111 | 000001 (+1) | 111111 (−1) |
| 000...000:111 | 000000 (0) | 000000 (0) |
| 000...000:011 | 111111 (−1) | 000001 (+1) |
| 000...000:001 | 111110 (−2) | 000010 (+2) |
| 000...000:000 | 111101 (−3) | 000011 (+3) |

Figure 8A:
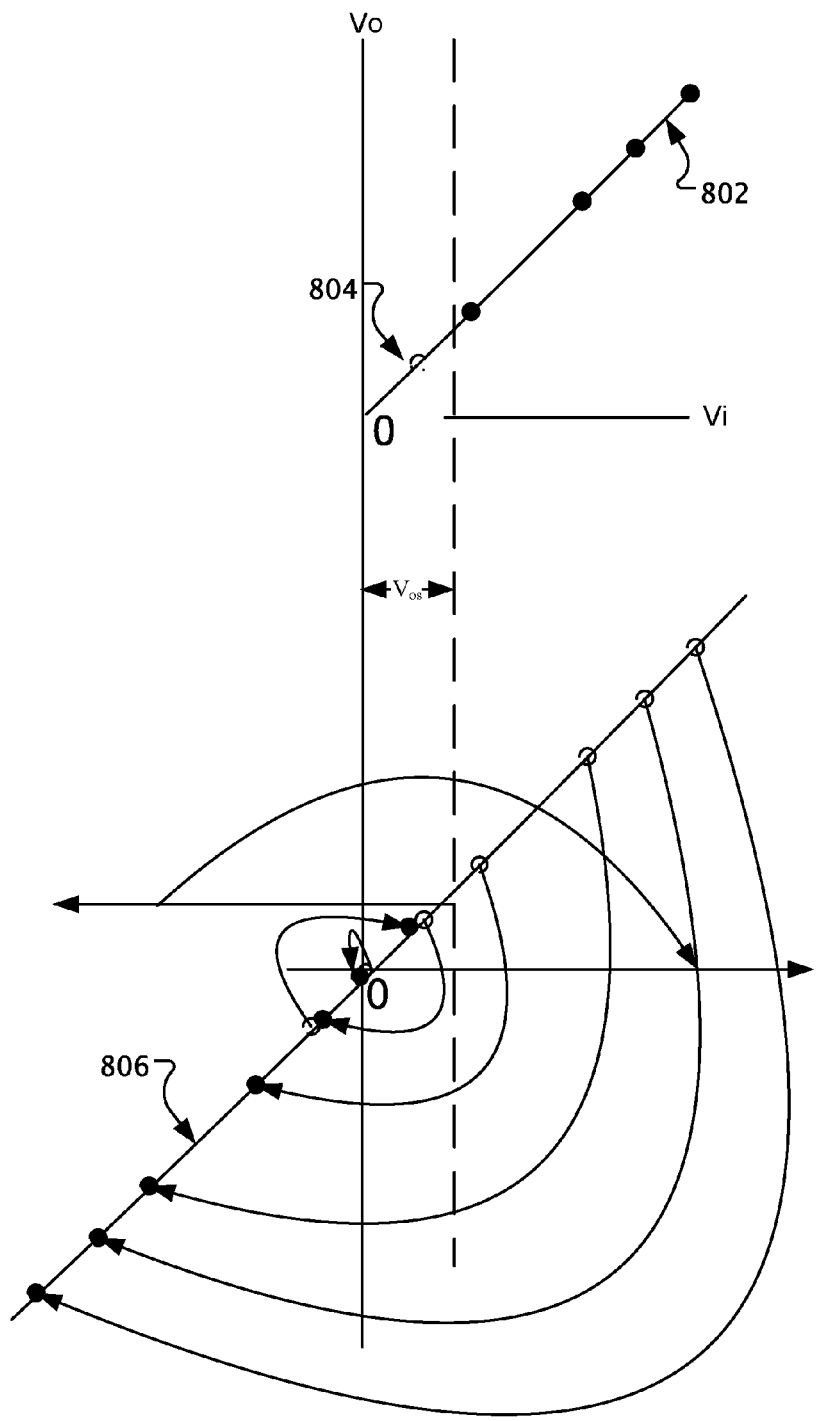
FIG. 8A shows an example missing code due to the presence of a positive offset in polarity decision.
Figure 8B:
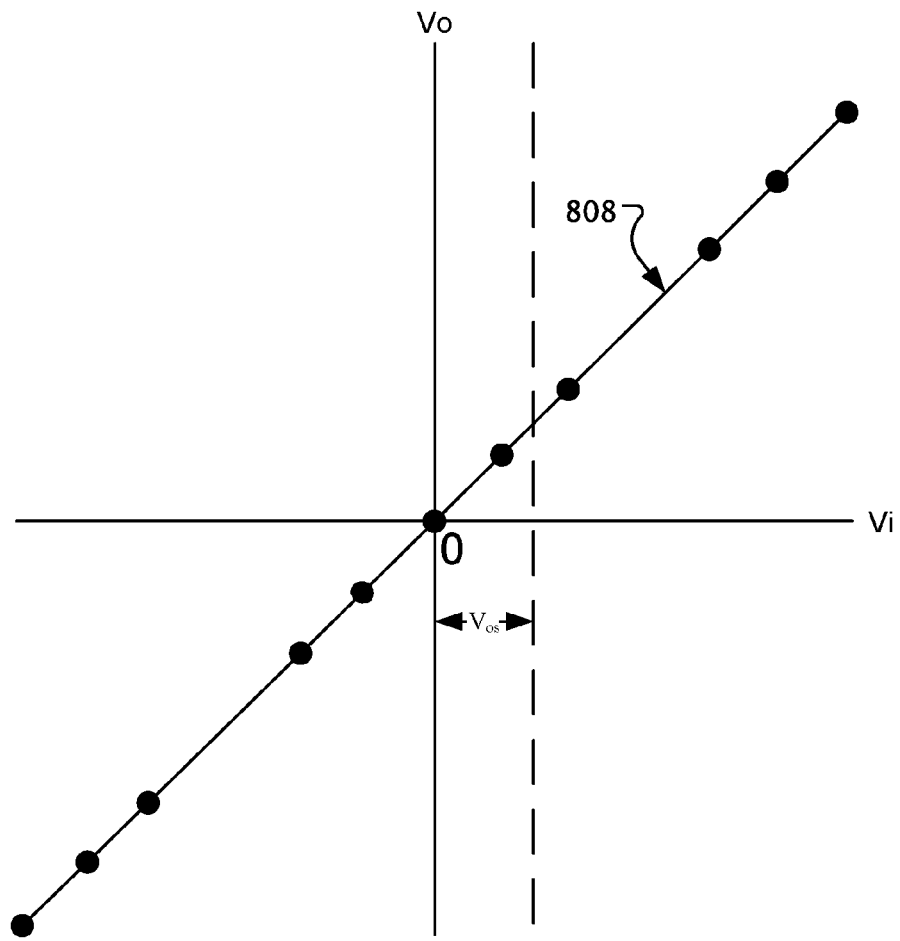
FIG. 8B shows a combined ADC transfer function with the missing code shown in FIG. 8A corrected.

FIG. 8A shows that the positive offset in polarity decision due to the error $V_{os}$ is corrected. As shown in FIG. 8A, the ADC transfer function 802 shows that the code 804 is missing when the polarity decision is logical one (Cmp_pol=1). The missing code 804 can be attributed to the error $V_{os}$ that arises due to the polarity decision offset, or in cases where no redundant comparators are provided. With redundancy error correction, the missing code can be corrected when the polarity of the input differential signal is inverted to obtain the ADC transfer function 806 (Cmp_pol=1). FIG. 8B shows a combined ADC transfer function 808 with no missing code. As shown in FIG. 8B, the ADC transfer function 808 combines the ADC transfer function 802 having the missing code 804 when the polarity decision is logical one with the ADC transfer function 806 with the missing code 804 corrected when the polarity decision is logical zero to arrive at an ideal transfer function with no missing code or distortion.

Figure 9A:
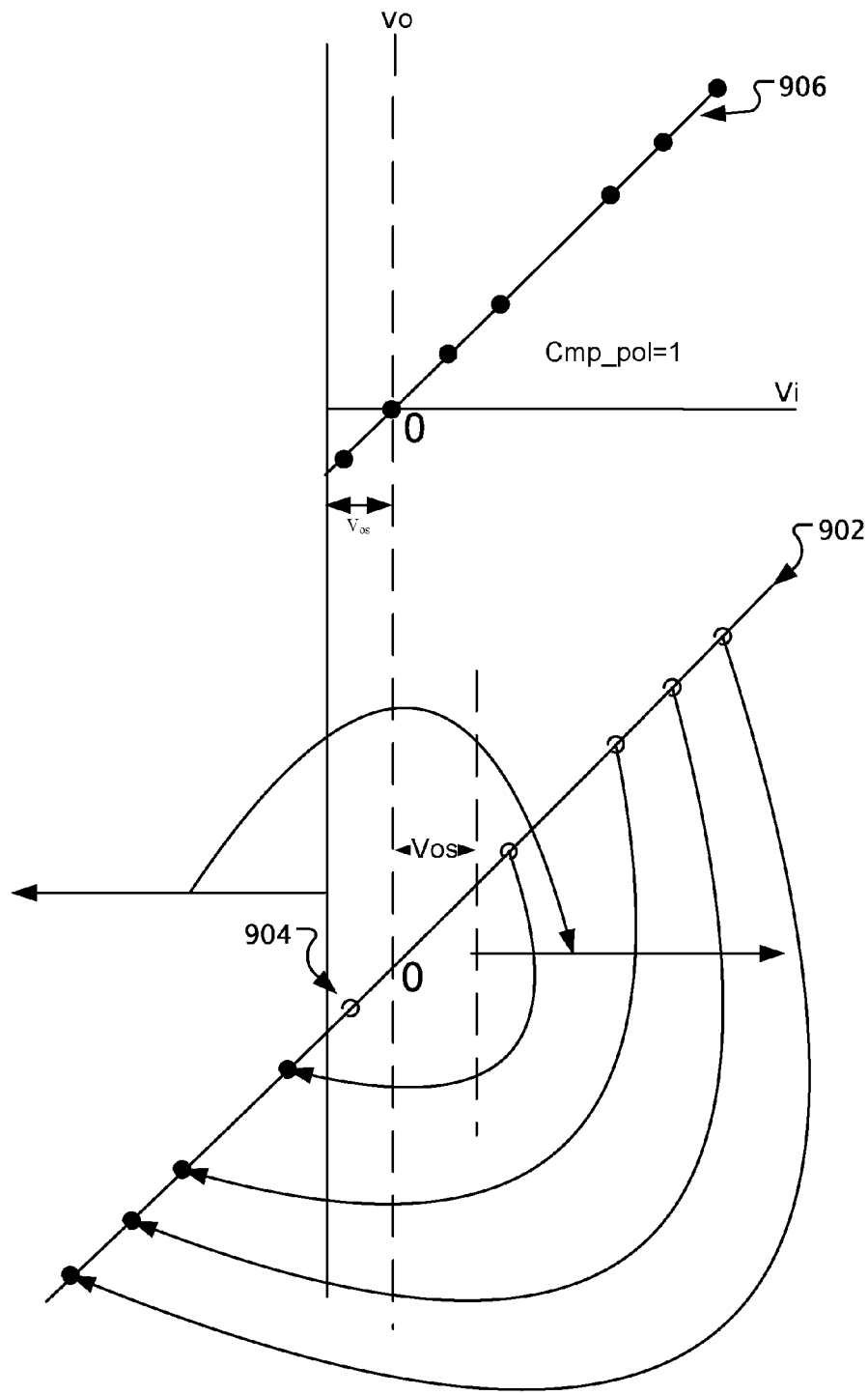
FIG. 9A shows an example missing code due to the presence of a negative offset in polarity decision.
Figure 9B:
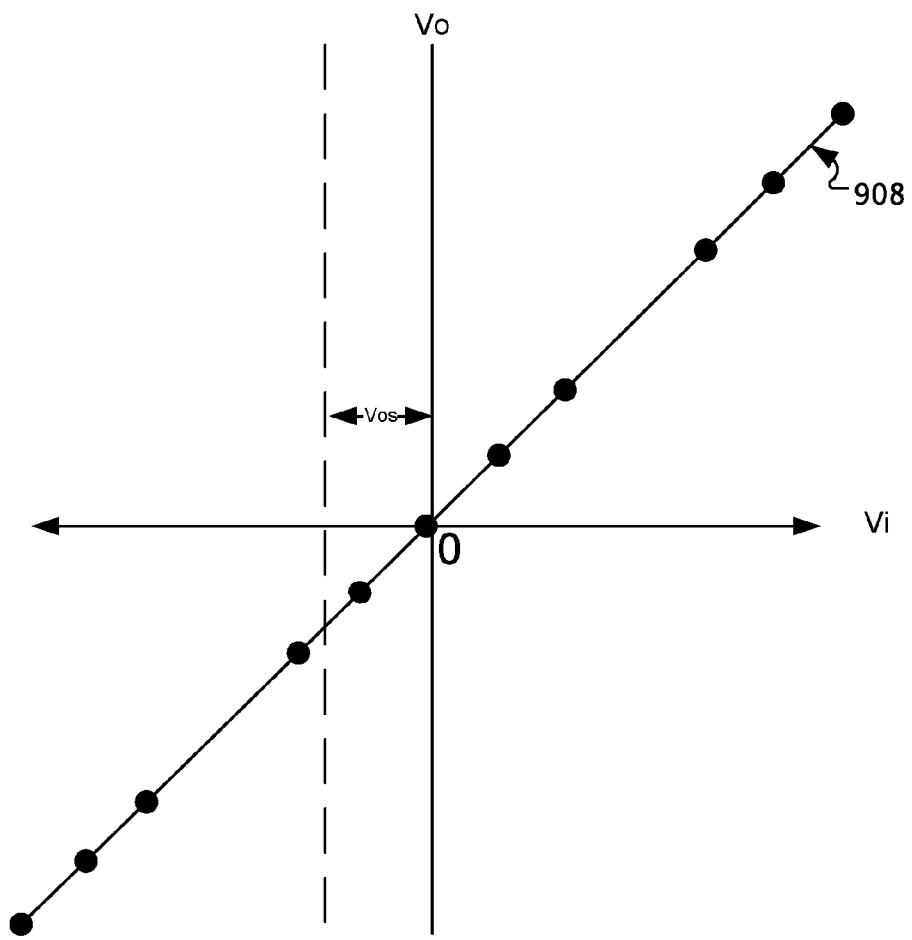
FIG. 9B shows a combined ADC transfer function with the missing code shown in FIG. 9A corrected.

FIG. 9A shows that the negative offset in polarity decision due to the error $V_{os}$ is corrected. As shown in FIG. 9A, the ADC transfer function 902 shows that the code 904 is missing when the polarity decision is logical zero (Cmp_pol=0). The missing code 904 can be attributed to the error $V_{os}$ that arises due to the polarity decision offset, or in cases where no redundant comparators are provided. With redundancy error correction, the missing code 904 can be corrected when the polarity of the input differential signal is inverted to obtain the ADC transfer function 906. FIG. 9B shows a combined ADC transfer function 908 with no missing code. As shown in FIG. 9B, the ADC transfer function 908 combines the ADC transfer function 902 having the missing code 904 when the polarity decision is logical zero with the ADC transfer function 906 with the missing code 904 corrected when the polarity decision is logical one to arrive at an ideal transfer function with no missing code or distortion.

Figure 10:
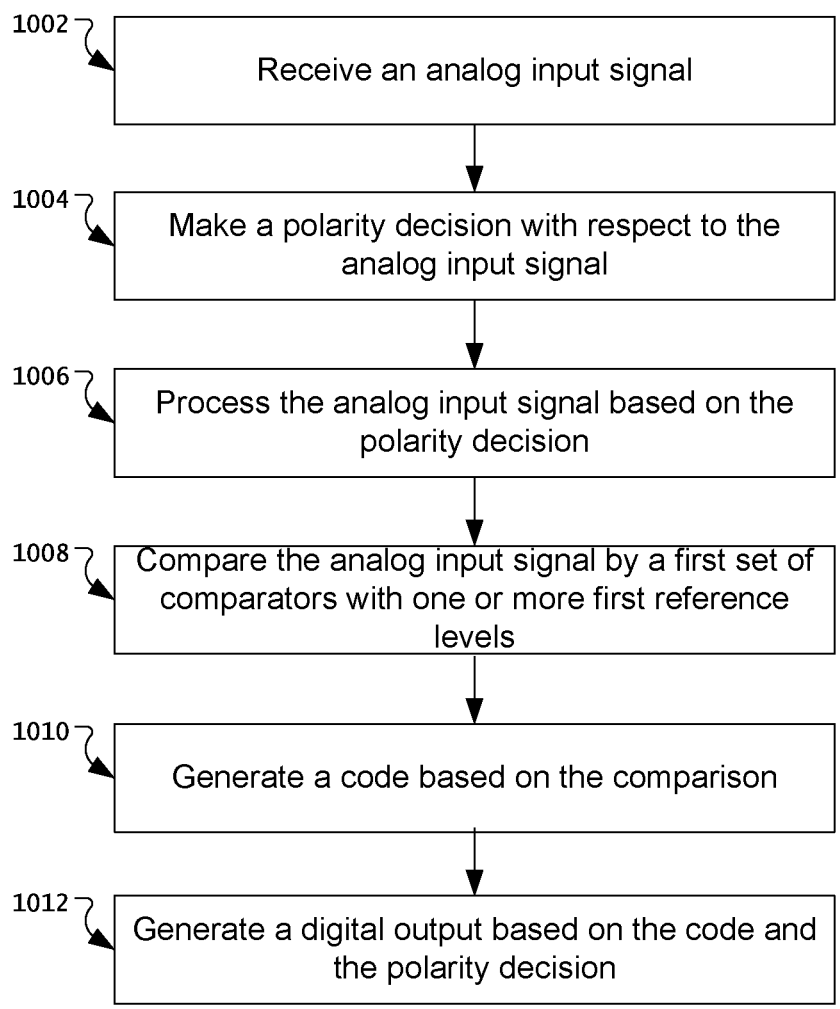
FIG. 10 is an example of a process for generating a digital output based on a polarity decision.

FIG. 10 is an example of a process for generating a digital output based on a polarity decision. The process 1000 can be performed, for example, by the flash ADC 200, and for clarity of presentation, the description that follows uses the flash ADC 200 as the basis of examples for describing the process 1000. However, another ADC, system, or combination of devices and systems, can be used to perform the process 1000.

Process 1000 begins with receiving an analog input signal (1002). A polarity decision can be performed by a polarity comparator on the analog input signal (1004). Then, the analog input signal can be processed based on the polarity decision (1006). In some implementations, the analog input signal can be compared by a first set of comparators with one or more first reference levels (1008). Based on the comparison, a code can be generated (1010). A digital output that corresponds to the analog input signal can subsequently be generated based on the code and the polarity decision (1012).

In some implementations, operations 1000-1012 can be performed in the order listed or in parallel (e.g., by the same or a different process, substantially or otherwise non-serially) to achieve the same result. Operations 1000-1012 also can be performed by the same or different entities or systems.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Other implementations fall within the scope of the following claims.

What is claimed is:

1. A method comprising:
   folding an analog input signal, having an associated first range, into a second range that is at most half of the first range;
   using first comparators to identify where the folded analog signal is located in the second range;
   using one or more second comparators to identify whether the folded analog signal is located outside of the second range; and
   generating a digital output signal, which corresponds to the analog input signal, based on outputs of the first comparators and the one or more second comparators.

2. The method of claim 1, wherein the second range is half of the first range.

3. The method of claim 2, wherein folding the analog input signal comprises:
   detecting that a voltage level of the analog input signal is less than zero; and
   inverting a polarity of the analog input signal in response to detecting that the voltage level of the analog input signal is less than zero.

4. The method of claim 3, wherein generating the digital output signal comprises:
   generating a code based on the outputs of the first comparators and the one or more second comparators;
   converting the generated code to a signed binary code; and
   outputting the signed binary code as the digital output signal.

5. The method of claim 4, wherein converting the generated code to the signed binary code comprises:
   maintaining a most significant bit of the generated code;
   inverting remaining bits of the generated code; and
   adding one to the inverted bits.

6. The method of claim 4, further comprising:
   removing bubble errors in the generated code.

7. A system comprising:
   a folder circuit configured to fold an analog input signal, having an associated first range, into a second range that is at most half of the first range; and
   a converter circuit configured to generate a digital output signal that corresponds to the analog input signal, the converter circuit including first comparators to identify where the folded analog signal is located in the second range and one or more second comparators to identify whether the folded analog signal is located outside of the second range.

8. The system of claim 7, wherein the converter circuit generates the digital output signal by generating a code based on the outputs of the first comparators and the one or more second comparators, converting the generated code to a signed binary code, and outputting the signed binary code as the digital output signal.

9. The system of claim 8, wherein the second range is half of the first range.

10. The system of claim 9, wherein the folder circuit comprises:
    a polarity detection circuit to detect whether a voltage level of the analog input signal is less than zero.

11. The system of claim 10, wherein the folder circuit further comprises:
    a polarity inversion circuit to invert a polarity of the analog input signal in response to the polarity detection circuit detecting that the voltage level of the analog input signal is less than zero and to output the inverted analog input signal as the folded analog signal.

12. The system of claim 11, wherein the converter circuit converts the generated code to a signed binary code by maintaining a most significant bit of the generated code, inverting remaining bits of the generated code, and adding one to the inverted bits.

13. The system of claim 10, wherein the folder circuit further comprises:
    a multiplexer circuit configured to output the analog input signal without polarity inversion in response to the polarity detection circuit detecting that the voltage level of the analog input signal is greater than zero.

14. The system of claim 13, wherein the converter circuit converts the generated code to a signed binary code by inverting a most significant bit of the generated code and maintaining remaining bits of the generated code.

15. The system of claim 8, wherein the converter circuit further comprises:
    a bubble correction circuit configured to remove bubble errors in the generated code.

16. A device comprising:
    an array of comparators configured to receive an analog input signal associated with a first range, the analog input signal having been folded from the first range into a second range that is at most half of the first range, the array of comparators including first comparators to identify where the folded analog signal is located in the second range and one or more second comparators to identify whether the folded analog signal is located outside of the second range; and
    an encoder circuit configured to generate a digital output signal, that corresponds to the analog input signal, based on output of the array of comparators.

17. The device of claim 16, wherein the encoder circuit comprises:
    a code generation circuit configured to generate a code based on the output of the array of comparators; and
    a code conversion circuit configured to convert the generated code to a signed binary code and output the signed binary code as the digital output signal.

18. The device of claim 17, wherein the encoder circuit further comprises:
    a bubble correction circuit configured to remove bubble errors in the generated code.

19. The device of claim 18, wherein the analog input signal is folded from the first range into the second range that is half of the first range.

20. The device of claim 19, wherein the folded analog signal is the analog input signal with polarity inversion when a voltage level of the analog input signal is less than zero.

* * * * *